(12) United States Patent
Bhowmik

(10) Patent No.: US 11,165,254 B2
(45) Date of Patent: Nov. 2, 2021

(54) SYSTEMS AND METHODS FOR ELECTRICITY GENERATION, STORAGE, DISTRIBUTION, AND DISPATCH

(71) Applicant: SINEWATTS, INC., Charlotte, NC (US)

(72) Inventor: Shibashis Bhowmik, Charlotte, NC (US)

(73) Assignee: Sinewatts, Inc., Charlotte, NC (US)

( * ) Notice: Subject to any disclaimer, the term of this patent is extended or adjusted under 35 U.S.C. 154(b) by 0 days.

(21) Appl. No.: 16/573,468

(22) Filed: Sep. 17, 2019

(65) Prior Publication Data

US 2020/0091726 A1    Mar. 19, 2020

Related U.S. Application Data

(60) Provisional application No. 62/732,685, filed on Sep. 18, 2018.

(51) Int. Cl.
| | |
|---|---|
| *H02J 1/00* | (2006.01) |
| *H02J 3/00* | (2006.01) |
| *H02J 3/38* | (2006.01) |
| *G05F 1/67* | (2006.01) |
| *H02J 13/00* | (2006.01) |
| *H01L 31/042* | (2014.01) |

(52) U.S. Cl.
CPC .............. *H02J 3/38* (2013.01); *G05F 1/67* (2013.01); *H01L 31/042* (2013.01); *H02J 3/385* (2013.01); *H02J 13/0003* (2013.01); *H02J 3/388* (2020.01)

(58) Field of Classification Search
CPC ........ H02J 3/385; H02J 13/0003; H02J 3/388; H02J 2310/12; H02J 3/322; H02J 7/35; H02J 3/38; G05F 1/67; H01L 31/042; Y02E 10/56; Y02E 70/30; H02S 40/38; H02S 40/32
See application file for complete search history.

(56) References Cited

U.S. PATENT DOCUMENTS

| | | | |
|---|---|---|---|
| 7,333,316 B1 * | 2/2008 | Norris | H02H 9/041 361/111 |
| 9,531,293 B2 | 12/2016 | Bhowmik | |
| 9,997,920 B2 | 6/2018 | Bhowmik et al. | |
| 10,069,304 B2 | 9/2018 | Bhowmik et al. | |

(Continued)

*Primary Examiner* — Hal Kaplan
*Assistant Examiner* — Rasem Mourad

(57) ABSTRACT

A property power system can include multiple photovoltaic (PV) panels to generate DC electrical energy from solar energy and a first power conversion module to convert between DC and AC electrical energy and to control aspects of each PV panel. The property power system can have a group of battery blades to store electrical energy and another power conversion module to convert between DC and AC electrical energy and to control aspects of each battery blade. The property power system can have a multiple synchronization interfaces configured to aggregate the AC electrical energy of each of the PV panels/battery blades, respectively, and to control delivery of the aggregated AC electrical energy. The property power system can include a grid circuit disconnector to prevent back-feed of power during grid outage condition while the PV panels or the group of battery blades is powering an electrical load center of the property.

6 Claims, 10 Drawing Sheets

(56) References Cited

U.S. PATENT DOCUMENTS

| | | | | |
|---|---|---|---|---|
| 2013/0181527 A1* | 7/2013 | Bhowmik | ............... | H02J 3/383 |
| | | | | 307/63 |
| 2015/0326023 A1* | 11/2015 | Adelberger | ............... | H02J 3/06 |
| | | | | 307/24 |
| 2017/0271912 A1 | 9/2017 | Bhowmik et al. | | |
| 2017/0338659 A1 | 11/2017 | Bhowmik et al. | | |
| 2018/0269829 A1* | 9/2018 | Narla | ...................... | H02S 50/00 |
| 2019/0165589 A1* | 5/2019 | Ichikawa | .............. | H02J 7/0047 |

* cited by examiner

SYSTEMS AND METHODS FOR ELECTRICITY GENERATION, STORAGE, DISTRIBUTION, AND DISPATCH

CROSS REFERENCE TO RELATED APPLICATIONS

This claims priority to U.S. Provisional Application No. 62/732,685 titled "Systems and Methods for Electricity Generation, Storage, Distribution, and Dispatch" and filed Sep. 18, 2019, the entirety of which is incorporated herein by reference.

TECHNICAL FIELD

The present disclosure relates generally to systems and methods for generating, storing, distributing, and dispatching energy generated by multiple energy sources such as a photovoltaic (PV) panel and a battery. In particular, systems for holistic integration of PV-battery systems for installation into particular locations are described.

BACKGROUND

With the higher proliferation of intermittent renewable generation resources, such as PV systems on power distribution networks, cost-effective grid management—voltage stabilization and frequency control—is increasingly becoming a challenge. The transformation of the electrical grid from traditional centralized power plants—primarily located on the bulk power system or network—to distributed power generation that can include substantial quantities of renewables on the distribution system or network may involve significant quantities of flexible generation and storage. In order to fully derive the value of renewable generation, intermittent resources are supplemented with a combination of fast ramp capable generation resources and distributed energy storage. This can be seen in the evolution of the so-called "duck curve" that is shown in FIG. 1.

Fast ramping resources are typically: (1) centralized multi-hundred megawatts (MW) combined cycle natural gas turbine-based power plants, also known as peaker plants; and (2) distributed energy storage consisting of large scale storage (compressed air, liquefied air, flow batteries, Li-Ion batteries) and customer-sited energy storage in residential, light and large commercial buildings. While centralized power plants are on the bulk power system (high voltage network), customer-sited storage, also known as behind-the-meter (BTM) energy storage systems, on the distribution network, are usually more readily available—from a situational perspective—and utilities are expected to become more reliant on BTM systems for managing their distribution networks with higher penetration of intermittent generation. BTM or customer sited systems are expected to be called upon to handle and manage grid imbalances, voltage and frequency disturbances, for example, low voltage ridethrough, frequency regulation for enhanced reliability and islanded or microgrid operation for system resiliency. Such systems can also deliver additional reliability and resiliency to the next generation, highly nimble grid.

While there exists a clear technical and business case for BTM storage systems, from grid operators' perspectives, return-on-investment associated with stationary storage or battery energy storage system (BESS) for the home and property owners (end customer) is questionable. The installed costs of BTM storage systems or BESS remain exorbitantly expensive—varying from $700 to 2,500/kWh—negating any potential derived value, from the homeowners' perspective, obtained from supplying grid services. Presently, these systems are heavily subsidized by jurisdictions that are in the forefront of renewable energy deployment—like California's Self Generation Incentive Program and New York's Reforming the Energy Vision Initiative—to mitigate first costs associated with these systems. The existing 1st GEN (First generation) systems suffer from mediocre lifetime battery cycle count and inferior system roundtrip efficiencies resulting in systems that are only warranted for 10 years when they are required to match PV system lifetime of 25 years or longer. Additionally, lack of active, granular battery management and chronic power conversion inefficiencies, of existing systems, can further confront and penalize system owners with significant safety concerns and increased lifetime ownership costs. Additionally, regulatory authorities and fire departments are grappling with the potential consequences of hazardous fire from non-actively managed batteries in the typical battery stack—stationary or mobile—while acknowledging the necessity for BTM storage on the distribution network for the next-generation grid. Accordingly, financial incentives alone are likely not sufficient to facilitate the required mass commercial deployment of storage systems on the distribution networks. Furthermore, without a substantial means of monetizing their investments, it is highly unlikely that BTM storage—at present pricing—will be adopted and become accepted by the majority of customers on the distribution network irrespective of the presence of PV system ownership on their properties. Hence, system affordability, system performance, extension of operational life and, system safety with a means for their further monetization will remain crucial to driving mass adoption and acceptance.

SUMMARY

In one example, a property power system includes an array of photovoltaic (PV) panels. The array of PV panels is configured to generate DC electrical energy from solar energy radiated toward the array of PV panels. In some examples, each PV panel of the array of PV panels includes a first power conversion module to convert between DC electrical energy and AC electrical energy and to control an operational characteristic of each PV panel. The property power system also includes a group of battery blades configured to store electrical energy. Each battery blade of the group of battery blades includes a second power conversion module to convert between DC electrical energy and AC electrical energy and to control an operational characteristic of each battery blade. The property power system includes a first synchronization interface that is configured to aggregate the AC electrical energy of each of the PV panels. The first synchronization interface may additionally control delivery of the AC electrical energy of each of the PV panels to multiple electrical outlets or panels. The first synchronization interface can also implement regulative protection including anti-islanding protection. The property power system additionally may include a second synchronization interface configured to aggregate the AC electrical energy of each of the battery blades, to control delivery of the AC electrical energy of each of the battery blades, as aggregated, to one or more of an electrical outlet or panel, and implement regulative protection including anti-islanding protection. The property power system also includes a grid circuit disconnector configured to select an islanded mode of operation and to prevent back-feed of power during grid outage condition while the array of PV panels or the group of battery blades is powering an electrical load center in a property that is electrically couplable to the array of PV panels, the group of battery blades, and a power grid.

In another example, a method of providing property power including generating DC electrical energy from solar energy radiated toward an array of photovoltaic (PV) panels. Each PV panel of the array of PV panels includes a first power conversion module to control various operational characteristics. The method also includes storing electrical energy by a group of battery blades. Each battery blade of the group of battery blades includes a second power conversion module to control various operational characteristics. The method includes aggregating DC electrical energy from of each of the PV panels by a first interface that performs various operations. Exemplary operations performed by the first interface include converting the aggregated DC electrical energy to AC electrical energy, implementing regulative protection including anti-islanding protection, and controlling delivery of the AC electrical energy to one or more of an electrical outlet or panel. The method also includes aggregating the electrical energy of each of the battery blades by a second interface that performs various operations. Exemplary operations performed by the second interface include converting the aggregated electrical energy to AC electrical energy, implementing regulative protection including anti-islanding protection, and controlling delivery of the AC electrical energy to one or more of an electrical outlet or panel. The method also includes selecting an islanded mode of operation by a grid circuit disconnector. The method further includes preventing back-feed of power during grid outage condition while the array of PV panels or the group of battery blades is powering an electrical load center in a property. In some examples, the property is electrically coupled to the array of PV panels, the group of battery blades, and a power grid.

DETAILED DESCRIPTION

Figure 1:
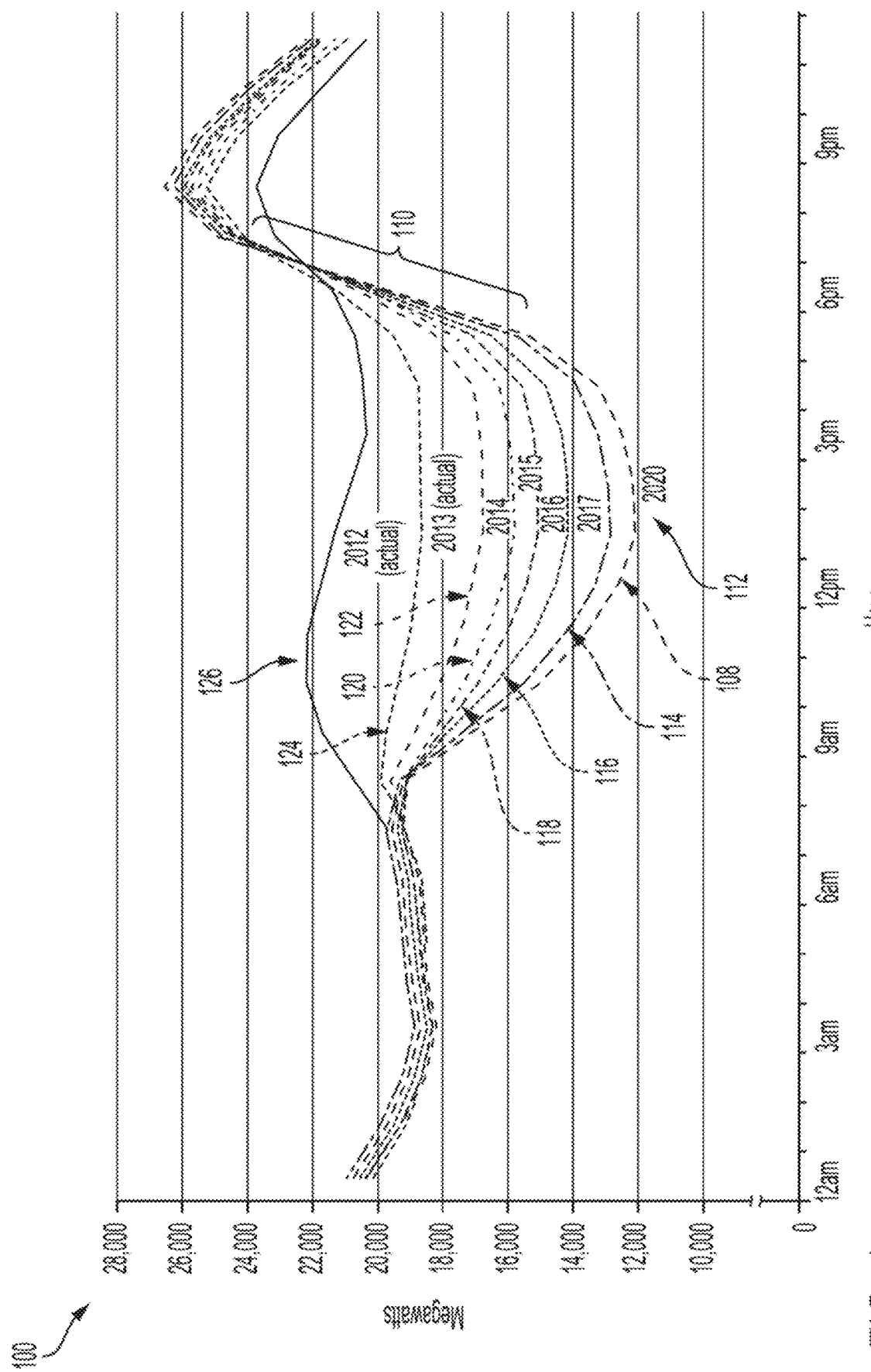
FIG. 1 is a chart that illustrates grid network load impacted by significant oversupply from variable generation resources according to one aspect of the present disclosure.

Certain aspects and features in this disclosure are related to a property power system that is installed at the property (e.g., behind a power meter). An example of one behind the property power system is a solar powered battery system, which converts solar radiation into electrical power and provides electrical power to electrical loads within the property. The electrical power from the solar battery system can be provided to the main electrical panel at the property. In some applications, this electrical power can provide the primary source of power for the property. In addition, the property power system can substitute for the utility grid during grid power outages. In other words, the property power system (a behind the meter system) is downstream to the property owner's electric power meter (e.g., coupled between the property and the electric power meter) and, under certain conditions, may remain operational while disconnected from the grid network. While providing power to the property and disconnected from the grid network, the power production is known as islanded operation (e.g., the property is on an island with respect to the grid network). The property power system (e.g., a PV-battery system) of the present disclosure may be safer and easier to install, operate and utilize relative to available property power systems. Additionally, the property power system enables prevention of back-feed (e.g., power flowing in the opposite direction when disconnected from the grid network) during islanded operation, provides an interface for controlling the respective alternating current (AC) output by the PV and battery systems with anti-islanding protection, and optimizes operational parameters of PV panels and battery cells. In addition, the disclosed PV-battery system advantageously combines granular battery management with power inversion in an integrated system.

In the following detailed description, reference is made to the accompanying drawings, which form a part hereof. In the drawings, similar symbols and reference characters typically identify similar components throughout the several views, unless context dictates otherwise. The illustrative aspects described in the detailed description, drawings, and claims are not meant to be limiting. Other aspects may be utilized, and other changes may be made, without departing from the scope of the subject matter presented here.

Before explaining the various aspects of the present disclosure in detail, it should be noted that the various aspects disclosed herein are not limited in their application or use to the details of construction and arrangement of parts illustrated in the accompanying drawings and description. Rather, the disclosed aspects may be positioned or incorporated in other aspects, variations and modifications thereof, and may be practiced or carried out in various ways. Accordingly, aspects disclosed herein are illustrative in nature and are not meant to limit the scope or application thereof. Furthermore, unless otherwise indicated, the terms and expressions employed herein have been chosen for describing the aspects for the convenience of the reader and are not to limit the scope thereof. In addition, it should be understood that any one or more of the disclosed aspects, expressions of aspects, and/or examples thereof, can be combined with any one or more of the other disclosed aspects, expressions of aspects, and/or examples thereof, without limitation.

In addition, in the following description, it is to be understood that terms such as front, back, inside, outside, top, bottom and the like are words of convenience and are not to be construed as limiting terms. Terminology used herein is not meant to be limiting insofar as devices described herein, or portions thereof, may be attached or utilized in other orientations. The various aspects will be described in more detail with reference to the drawings.

In various aspects, the disclosed BTM storage system is a PV-battery system for distributed generation (DG) or distributed energy resource (DER) such that a property owner may install the system without employing professional help. Property includes buildings, residences, automobiles, other real property and other suitable property. The disclosed system may also be installed by professional personnel (e.g. licensed electricians) at a significantly lowered cost due to elimination of system complexity compared to conventional systems. The disclosed system is advantageous for several additional reasons, including improved efficient power conversion, granular optimization of battery operation and PV panel operation, reduced costs, control of bidirectional energy transfer, and increased safety. The PV-battery system may comprise an enhanced inverter component (EIC), enhanced grid interface termination box (eGITB), and retrofittable Grid Circuit Disconnector (GCD), which are described in further detail below. The inverter component may be a suitable inverter such as the Synchronized Inverter Molecule® available from SineWatts, Inc. of Charlotte, N.C.

The eGITB and EIC architecture enables vectoral stacking of individual AC output from each PV panel of a group of PV panels or each battery blade of a group of battery blades. Each battery blade consists of multiple battery cells. Battery blades may also be known as battery stacks or battery banks. In particular, the BTM system can comprise one or more strings, in which each string comprises a plurality of string members that each includes a voltage source and inverter component. The inverter component may be the EIC, which is a bi-directional low voltage inverter capable of individually converting the DC voltage of each PV panel or battery blade into its respective AC output. These individual AC outputs may inherently be vectorally summed into a single combined AC output. Accordingly, a PV panel string and a battery blade string are each connected to their corresponding eGITB and provide their respective consolidated AC output to the corresponding eGITB. One benefit of this architecture is that each dedicated EIC (corresponding to each string member) optimizes each string member. In other words, for each PV panel string member of the PV panel string, the corresponding dedicated EIC may achieve maximum power point tracking (MPPT) and rapid shutdown (e.g., based on fault detection or emergency crew instigated electric service interruptions). In addition, for each battery blade string member of the battery blade string, the corresponding dedicated EIC may achieve individualized battery blade charge-discharge management and active charge balancing among the group of battery blades.

In this way, the system architecture inherently combines granular battery management with the power inversion process. Additionally, due to the architecture, the battery operation optimization can be independent of the PV panel operation optimization. Vectoral summation allows this PV-battery system to advantageously obviate the need for a high voltage intermediate DC bus and enables the use of identical hardware for both the PV and battery subsystems. Nonetheless, different hardware may be used under suitable circumstances. In the disclosed AC-stacking architecture, the vectoral summation of the low voltage EICs results in a consolidated AC output that is provided to the eGITB. To this end, the PV panel string and a battery blade string may each have a corresponding eGITB. The eGITB may comprise a mechanism for allowing and safeguarding unidirectional and bidirectional power flow to the PV panels and battery blades, respectively. In particular, the eGITB may improve the safety of the system by implementing an anti-islanding algorithm and back-feed prevention, as described in further detail below.

The eGITB and EIC architecture may increase power conversion efficiency. The disclosed PV-battery system may also equitably distribute the electrical load of the subject property where the system is installed such that battery life is extended. In addition, the system can enhance dispatching of the available power capacity at the property by grid operators to address the disparity between forecasted load and electrical generation by the local utility. For example, the battery blades may store the increased energy generated during the middle of a day when energy unit rates (measurable in kilowatt hours (kWh)) are expected to be low due to lower demand (load) and excess generation, as discussed with reference to FIG. 1. Similarly, the battery blades may supply the stored energy to meet higher demand (load) in the evening and early nighttime hours when energy unit rates are expected to be higher, also as discussed with reference to FIG. 1. The battery blades can be located in a separate portion of the property than the PV panels.

Another aspect of the invention will enhance the benefit for the system owner by utilizing the rate differential, as described above, while serving and fulfilling the grid requirements of maintaining load versus generation equilibrium at the distribution network. Additionally, these individual systems may be aggregated by system aggregators, DER management system (DERMS) operators, grid operators or the competent authority for excess available capacity and supply the bulk power requirements of Regional Transmission Organizations (RTOs) and Independent System Operators (ISOs). The inclusion of the GCD enables property owners to operate DG resources or DER (e.g., PV panels and/or battery blades) in an islanded mode or off-grid or grid-disconnected mode. Importantly, the GCD implements back-feed prevention when the PV panel or battery blade is operated in an islanded mode. That is, the GCD prevents electricity from flowing back through the property's main circuit breaker to the corresponding power grid, such as the power grid of the local power utility. The GCD may comprise a controller for detecting an outage at the power grid or when the grid voltage or frequency has violated their thresholds per applicable regulations. In such detected circumstances, an islanded mode of operation may be appropriate. Thus, even in power grid outage situations, the property owner may safely utilize the energy provided by the PV panels and/or battery blades for the loads in the property. The property owner could also predesignate only certain load circuits in the property to receive power from the DER, which may further promote optimum usage of on-site energy resources in an off-grid mode. The GCD may also be utilized in DER systems comprising of other types of generation resources (e.g. fuel cell generators, microturbines and such) and other types of storage resources (compressed air energy storage (CAES), liquid air energy storage (LAES), flywheel energy storage and such).

FIG. 1 is a chart 100 illustrating the evolution, over the years, of the intraday variations of electric load on their network for a typical spring day. As the utilization of PV for electrical generation increases, customer-sited generation also increases, thereby reducing demand during the middle of the day when solar insolation is typically abundant. However, as the day progresses, with reducing solar insolation, the demand increases rapidly during the sunset hours. The x-axis of the graph indicates the time during a day while the y-axis of the graph indicates the amount of load as measured in megawatts (MW). The existing centralized electric grid was not designed to handle rapid demand fluctuations due to over and under supply from variable generation resources. As illustrated by the chart, the risk of overgeneration is predicted to increase as PV becomes more prolific. The issues of overgeneration risk and steep ramping needs, as portrayed by the graph, may be addressed by the improved BTM system of the present disclosure. FIG. 1 illustrates various year's corresponding to each line along the chart. For instance, line 108 corresponds to a usage chart for 2019, line 114 corresponds to a usage chart for 2018, line 116 corresponds to a usage chart for 2017, line 118 corresponds to a usage chart for 2016, line 120 corresponds to a usage chart for 2015, line 122 corresponds to a usage chart for 2014, line 124 corresponds to a usage chart for 2013, and line 126 corresponds to a usage chart for 2012. A particular point of interest in the chart is the 3-hour ramp depicted by portion 110. A forecast usage point for 2020 corresponds to estimated point 112.

Figure 2A:
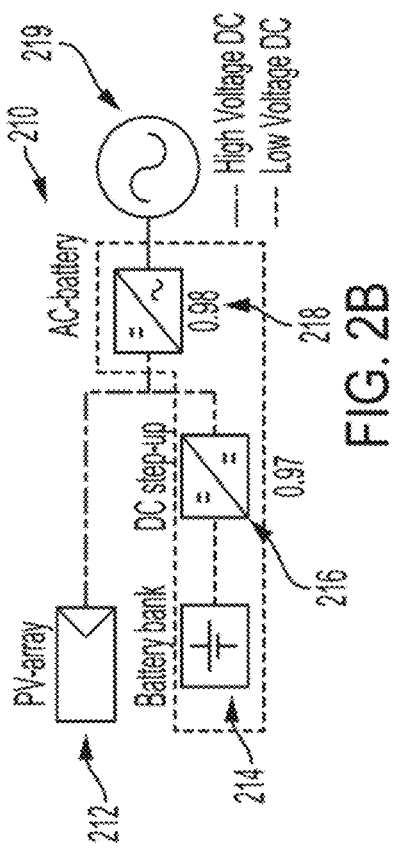
FIGS. 2A-2C illustrate various power inversion architectures for PV-battery systems that employ a centralized or string inverter, according to one aspect of the present disclosure.
Figure 2B:
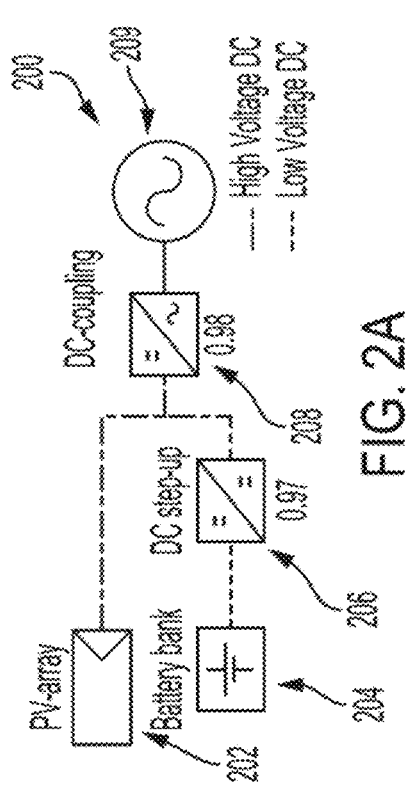
Figure 2C:
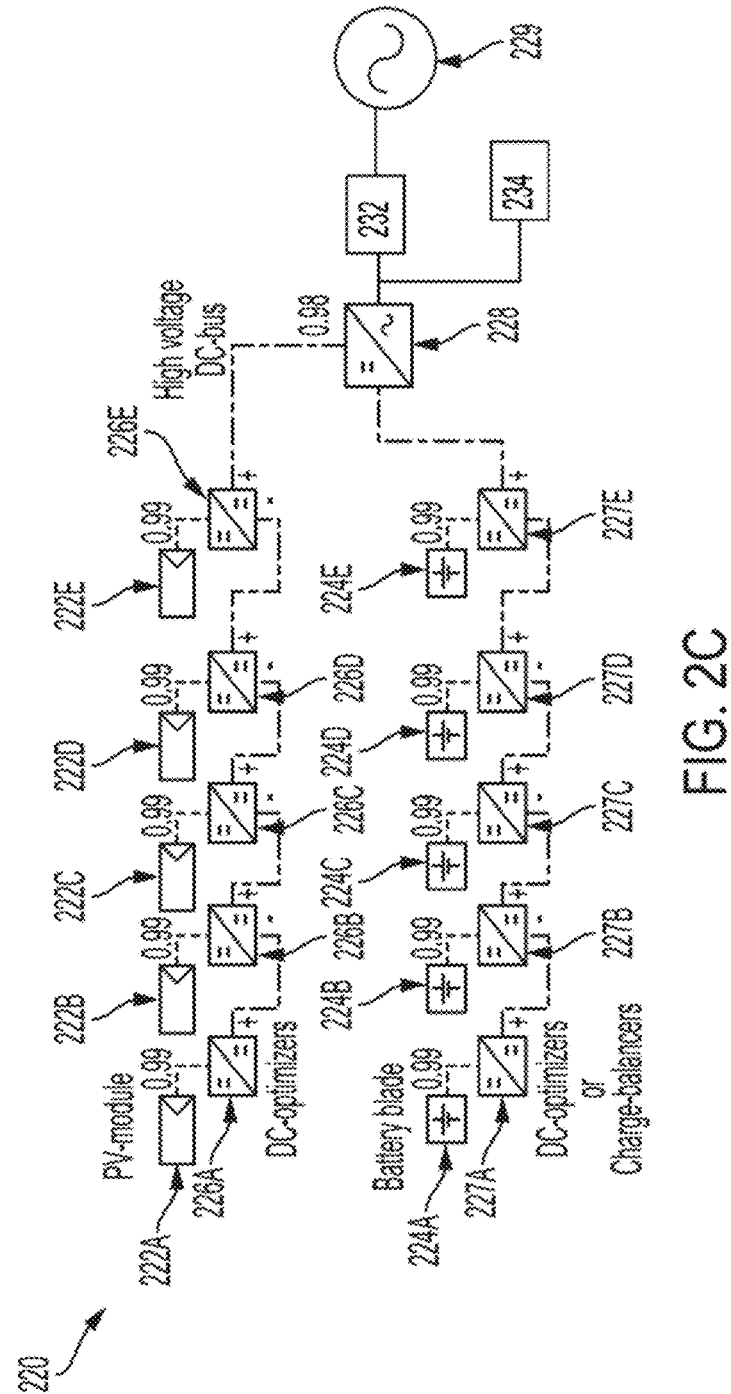

FIGS. 2A-2C illustrate various power inversion architectures for PV-battery systems according to various aspects of the present disclosure. FIGS. 2A-2B show conventional high voltage power inversion architectures that employ a centralized or string inverter. The DC-coupling architecture 200 of FIG. 2A uses a DC step-up converter 206 to step up the voltage of the battery bank 204 to match that of the inverter's internal DC-voltage bus. This internal DC voltage level is typically set by the connection requirements to the AC-grid 209. The DC-coupled PV array 202 is also required to adhere to this voltage bus requirement by the inverter circuitry. In particular, the DC step-up converter 206 may convert low voltage such as 48 volts (V) to high voltage such as 500V, 700V or 900V. A central inverter 208 is used to convert the input high voltage DC to output high voltage grid AC. The conversions may realize losses. For example, the DC step-up conversion may have a one-way efficiency of 97% or lower while the centralized power inversion may have a one-way efficiency of 98% or lower. The AC battery architecture 210 of FIG. 2B operates similarly as that of FIG. 2A, with the operation illustrated by inclusion of the PV array 212, battery bank 214, DC step-up converter 216, central inverter 218 in the AC battery of FIG. 2B, and AC output 219. Accordingly, a typical 95% or lower one-way efficiency may be realized for the architectures of FIGS. 2A-2B. Accounting for both the charging and discharging operations, conventional architectures such as those of FIGS. 2A-2B may realize roundtrip efficiencies in an approximate range of 86% to 90%. FIG. 2C shows a power conversion architecture 220 that utilizes a central inverter 228 and modular DC-optimizers 226A-226E for maximum power point tracking (MPPT) operation of the PV panels 222A-222E and modular DC-optimizers 227A-227E for charge balancing of the battery blades 224A-224E collectively, in the "battery bank 224". Consequently, the separate DC step-up operation is eliminated in FIG. 2C. A modular DC-optimizer 226A-226E may be used for each PV panel 222A-222E, collectively "PV array 222" and for each battery blade 224A-224E in the battery bank 224 (i.e., a group of battery blades). The PV panels 222A-222E and battery blades 224A-224E may be arranged in series, parallel, or a combination of both, respectively. FIG. 2C shows a series of modular DC-optimizers (226A-226E and 227A-227E) forming a high voltage DC bus. A central inverter 228 (e.g., a string inverter) then converts the string DC flowing through the high voltage DC bus. The property power system may include a grid circuit disconnector (GCD) 232 between the inverter 228 and utility grid 229 to accommodate both on-grid and off-grid (islanded) modes of operation and serve the property electrical loads 234. Based on the DC-optimizer operation occurring at an estimated 99% conversion efficiency and the central inversion occurring at an estimated 98% or lower efficiency, the power conversion architecture 220 of FIG. 2C realizes an estimated one-way system efficiency of 96% to 97% and an estimated roundtrip system efficiency of 92% to 94%. While a GCD is only depicted in FIG. 2C, it will be appreciated that a GCD can be included in FIGS. 2A-2B.

Figure 3:
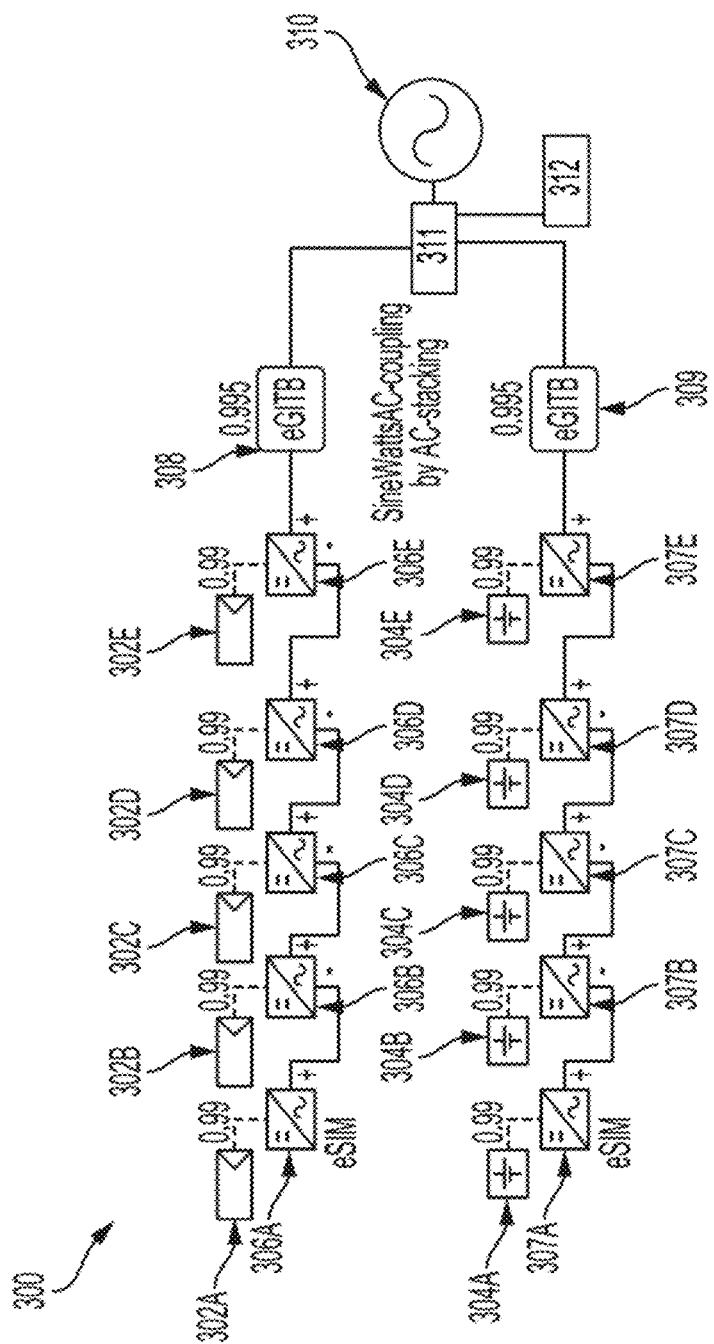
FIG. 3 illustrates a PV-battery system power inversion architecture using low voltage AC conversions with inherent vectoral summation according to one aspect of the present disclosure.

FIG. 3 illustrates a PV-battery system power inversion architecture using low voltage AC conversions with inherent vectoral summation, according to various aspects of the present disclosure. The disclosed BTM architecture 300 combines high power conversion efficiency with granular battery and PV management. As shown in FIG. 3, a PV-module string 302 comprises a series of PV panel string members 302A-302E that each has a corresponding bi-directional granular inverter 306A-306E (e.g., EIC). Similarly, a battery blade string 304 comprises a series of battery blade string members 304A-304E that each has a corresponding EIC 307A-307E. Any appropriate number, as determined by system characteristics such as the grid voltage level and requirements, as well as the individual voltage source level and variability (PV or battery blade); of string members can be employed. Accordingly, FIG. 3 portrays two separate strings, although any number of strings could be engaged as permissible by the architecture, hardware, and equipment power rating. Thus, the system will allow multiple PV strings or multiple battery blade strings connected to their respective eGITB (e.g., PV eGITB 308 and battery eGITB 309). FIG. 3 also includes a GCD 311 coupled to each of the respective eGITBs and the utility grid 310 to accommodate both on-grid and off-grid (islanded) modes of operation and serve the property electrical loads 312.

Alternatively, each string member may comprise one or more PV panels and one or more battery blades combined into one generation-storage voltage source (GSVS). An appropriately configured EIC connected to each GSVS can then be utilized to manage and optimize both its PV panel(s) and battery blade(s). In some examples, the battery blades 304A-304E are stacked inside an enclosure and installed in the interior of a property (e.g., a garage of a residence, a utility room of a commercial building), although the battery blades 304A-304E may be installed in any suitable location including being co-located with the PV panels 302A-302E. The EICs (PV EICs 306A-306E or battery bank EICs 307A-307E) and eGITB (PV eGITB 308 or battery bank eGITB 309) may also be used with battery blades in other suitable applications besides real property. For example, the EICs and eGITB can be used to manage the charging and discharging of battery blades or battery stacks inside an electric vehicle (EV), hybrid electric vehicle (HEV) or plug-in hybrid electric (PHEV) vehicle. The battery stacks and their corresponding EICs may be housed inside the battery enclosure of the EV, HEV or PHEV. The corresponding eGITB may also be an integral part of the vehicle or may also be installed in a portion of the property (e.g., the garage or somewhere convenient in the property). The corresponding eGITB can charge the battery stacks while implementing active battery management as described above. The output of the respective eGITBs 308 and 309 is AC output and may be connected to the utility grid 310.

Furthermore, the eGITB may supply energy back to the grid in a vehicle to grid (V2G) mode. The array of PV panels may be installed outside, such as on the rooftop of the property or at any other location suitable for the application.

The EICs enable granular, high efficiency low voltage DC to AC conversions with inherent vectoral summation.

The presently disclosed architecture does not require a high voltage intermediate DC bus, thus eliminating any DC wiring as reflected in the DC-coupled architectures shown in FIGS. 2A and 2B. It relies solely on the property's existing AC-wiring, thereby, improving safety of the system due to the inherent benefits of an AC-system. This may also reduce the cost and improve the efficiency of the system. Instead of the high voltage DC bus, the plurality of low voltage AC output by the string members are inherently aggregated without the requirement of any control communications and provided to the corresponding eGITB (i.e, PV eGITB 308 or battery bank eGITB 309). The eGITB (i.e., PV eGITB 308 or battery bank eGITB 309) is a disconnection mechanism, string protection and grid-to-string synchronization unit (e.g., a synchronization interface) comprising electrical, electronic, and electromechanical components. The eGITB aggregates the plurality of output AC so that the eGITB may act as a voltage source for the property. For example, the eGITB may provide 120V, 240V or some other appropriate voltage in a single or polyphase configuration. While only 240V single phase is depicted in FIG. 3, it should be appreciated that other grid voltages such as 208V, 480V 3-phase, and other known grid voltages may also be used. To this end, the eGITB can be plugged into 120V or 240V outlets incorporated into a wall of the property. The eGITB may also have a controller configured to supply control signal(s), over wired or wireless connection, to the string members (individually or as a group) to dynamically control the low voltage power AC inversion or DC conversion. Specifically, in some situations, it may be desirable to implement a simplified DC architecture so that the string members output DC that is inherently aggregated and provided to the corresponding eGITB configured to operate in DC-mode. For synthesizing a DC output—a scalar quantity—at the corresponding eGITB, synchronization of the string members is not a necessity. However, each of the individual EICs will need to be configured for DC output. Accordingly, the architecture and the same hardware may be adapted to handle both AC output and DC output at the EIC and eGITB. An EIC/eGITB string configured for DC output will require an additional DC-AC inverter to connect to the electric grid. An eGITB configured for DC output may be part of the AC/DC inverter hardware and accordingly, reside in the same inverter enclosure. For example, the eGITB could set a voltage or current characteristic of the inversion to achieve a desired power or current in grid-tie mode and desired power or voltage in off-grid mode. More generally, the eGITB can control the power factor of the system, protect the battery blades, and PV panels based on fault diagnosis and detection (e.g., using key performance indicators and degradation profile), account for variations in environmental conditions, and adjust operational field quantities (voltage, current) of the battery blades and PV panels. Furthermore, the eGITB may allow and control the bi-directional power flow for storing energy and supplying power to electrical loads. The eGITB also can implement anti-islanding protection, which can be determined by a suitable islanding detection method (e.g., determining that a change in command frequency is consistently positive or negative and determining whether the change in command frequency is within a threshold band) such as that described in U.S. Pat. Nos. 9,997,920 and 10,069,304.

Figure 4:
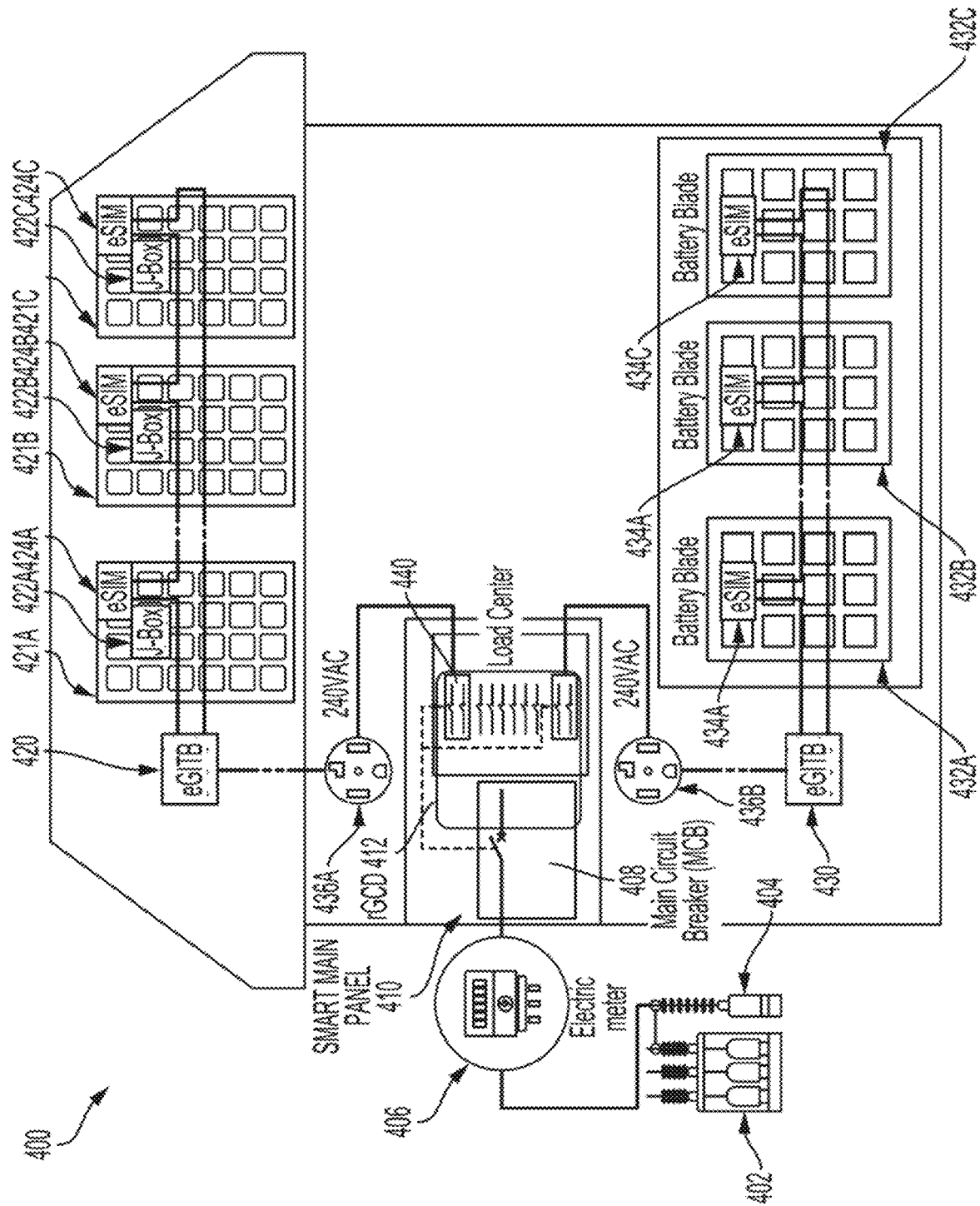
FIG. 4 depicts various PV-battery system components according to one aspect of the present disclosure.

FIG. 4 depicts various PV-battery system components according to various aspects of the present disclosure. Specifically, the EIC, eGITB, and GCD are shown in the context of a residential property 400, such as a house. As can be seen in FIG. 4, the PV panel array (i.e., including panel arrays 421A-421C) is installed in the house rooftop while the battery blades (432A-432C) are housed in a house enclosure. Each PV panel of the PV panel array 421A-421C has a corresponding EIC 424A-424C and junction box 422A-422C. In an alternate arrangement, the functionalities of the junction box 422A-422C may be fully accommodated by the EIC 424A-424C to eliminate the junction box from the PV panel. Each battery blade 432A-432C has a corresponding EIC 434A-434C. The PV panel array (421A-421C) and the group of battery blades (432A-432C) each may provide 240V in AC output (e.g., PV AC output 436A or battery blade AC output 436B) from their respective eGITB (i.e., PV panel array eGITB 420 or battery blade eGITB 430) to the main electric panel (which includes the main circuit breaker 408) or the load center of the house. In this way, the DER (PV-battery system) resources may be used for the power demands of the house before power from the local utility power grid is consumed (as tracked and indicated by the associated electric meter 406 shown in FIG. 4). The GCD 412 (illustrated inside the Smart Main Panel 410) shown in FIG. 4 also enables operating the PV-battery system in an islanded mode. As discussed above, an islanding condition such as when the local utility power grid experiences a power outage can be detected using a suitable islanding detection method. Thus, when the GCD 412 and the connected eGITBs (i.e., PV panel array eGTIB 420 or battery blade eGITB 430) detect a grid outage condition, the GCD 412 may be disconnected or disengaged to isolate the rest of the load center from the house's main circuit breaker 408 (MCB). Various embodiments of the GCD 412 are achieved as disclosed in FIGS. 5-6 and FIGS. 8-9. Consequently, the GCD 412 may allow the house or the property to be electrically serving its loads from the PV panel array 421A-421C and/or battery blades 432A-432C while the house remain disconnected from the local utility power grid 402. In other words, the GCD 412 disconnects the house from the local utility power grid (e.g., first portion of utility grid 402 or second portion of utility grid 404). to prevent back-feed from the DER during islanded mode of operation. In addition, the GCD 412 may comprise circuitry for synchronization, communications and telemetry in both the grid-connected and off-grid mode of operations. For example, the GCD 412 circuitry can be used to communicate with the competent power grid authority and respond to grid operator and/or system aggregator signals for increasing or decreasing active and reactive load of the property, in response to real-time grid requirements. The GCD 412 may also adjust building active and reactive loads (e.g., 240V load 440) based on learning customer and/or building occupants' energy usage and dynamic load profile to maximize benefits for the owner by serving instantaneous grid support and fulfilling pre-assigned or on-demand capacity dispatch requirements. Accordingly, the GCD 412 may allow a single point of access for the competent authorities to access, control, monitor these individual DER systems to verify, meter and settle energy transactions for grid support and advanced grid operations and fulfill the requirements of a DER management system (DERMS). As used in this disclosure, grid-connected, grid-tie, or grid-interactive mode may refer to operation of the system at the property when connected to the external grid network for regular utility grid mode, microgrid mode or local neighborhood nanogrid mode.

Figure 5:
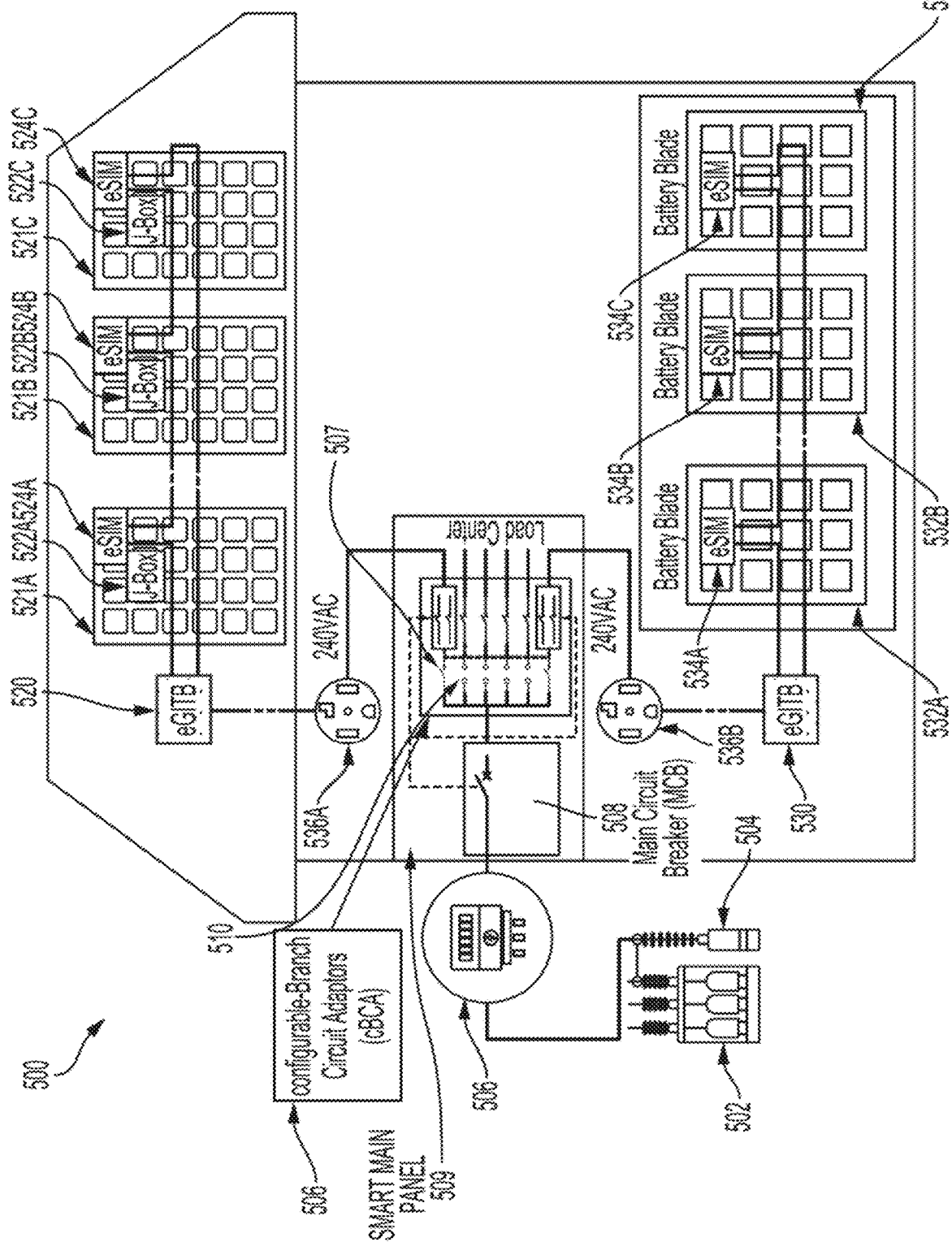
FIGS. 5-6 depict a configurable and retrofittable grid circuit disconnector component according to one aspect of the present disclosure.
Figure 6:
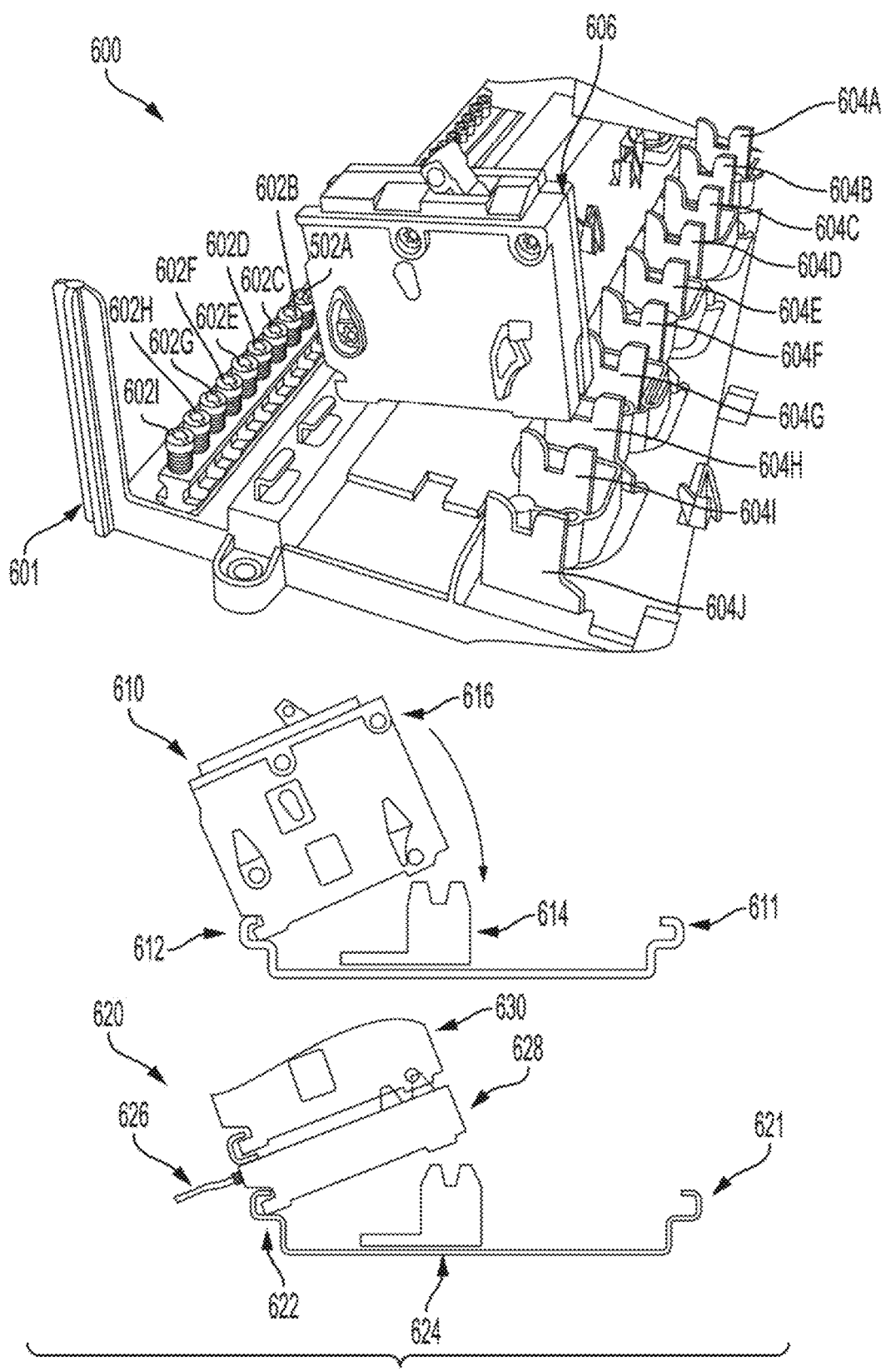

FIGS. 5-6 depict an embodiment of the GCD 509 that is retrofittable for existing residential main electric panels and may be configured to allow selective loads of the house be served during a grid outage according to various aspects of the present disclosure. In FIG. 5, the GCD is implemented as configurable branch circuit adapters, cBCA 506, comprising switched disconnectors 507 and branch circuit isolators 510 for islanded operation. New wiring is built into the configurable branch circuit adapters, cBCA 506, and selectively employing switched disconnectors 507 and branch circuit isolators 510 may serve the owner's load requirements. The branch circuit isolators 510 may be easily installed in an electric panel (which typically includes the main circuit breaker 508) by the property owner. In this way, the property owner may predetermine and selectively choose critical load circuits in the home that are served during islanded operation. Other non-critical load circuit breakers will be adapted with a circuit breaker isolator 510 which may be configured to isolate on both sides of the adapter—grid-side and load-side, such that the non-critical load circuit breaker is completely isolated and electrically floating when in islanded mode of operation and remain connected when in grid-tie mode operation, thereby, allowing the non-critical loads to operate in grid-tie mode only. To this end, the property owner may install switched disconnectors 507 for those load circuits that the owner desires to derive power from, during islanded operation, such as the circuits to which the eGITBs (of the PV array 521A-521C and/or the group of battery blades 532A-532B) may be connected. Additionally, circuit breaker isolators 510 may include branch circuit isolators that may be installed for those loads that the owner desires to power during islanded or off-grid operation and configured for isolation on the grid-side only. The combination of the adapters for switched disconnectors 507 and branch circuit isolators 510 implements a GCD 509 that is retrofittable. Normal load circuits will remain energized during grid-tie mode operation and will be disconnected, by design, during grid outage or off-grid or islanded operation. Thus, the cBCA 506 of FIG. 5 is configurable by the homeowner and enables further flexibility in managing and customizing the various load circuits. This may result in reduced electrical consumption and consequently preserve energy resources as well as reduce waste. In particular, this may extend the life of battery blades 532A-532C and/or optimize which loads in the house receive power. FIG. 5 also depicts that each PV panel of the PV panel array 521A-521C has a corresponding EIC 524A-524C and junction box 522A-522C, each battery blade 532A-532C has a corresponding EIC 534A-534C, and the grid circuit has a first portion 502 and second portion 504, and an electric meter 506. Each of the PV panel array 521A-521C and the battery blades 532A-532C can have a respective PV eGITB 520 and a battery bank eGITB 530, further coupled to PV AC output 536A and battery bank AC output 536B.

FIG. 6 shows one aspect of the circuit breaker adapters with in-built isolator or switched disconnect and monitoring circuitry. Such in-built bypass wiring in the adapters may accomplish the circuit modification for DER islanded mode operation with only minimal involvement of the property owner. This circuit modification may leave the remainder of the main panel and home system configured for normal grid-tie mode operation. For example, FIG. 6 illustrates a circuit breaker mounting 601 inside a main panel 600. A circuit breaker 606 may be coupled to the neutral bar 602 and bus bar 604. FIG. 6 also illustrates a side view of main panel 610 including a circuit breaker 616, neutral bars 611 and 612 and bus bar 614. FIG. 6 further illustrates a circuit breaker mounting inside a main panel 620 including a circuit breaker 630, a circuit breaker adapter 628, and neutral bars 621 and 622, bus bar 624 and bypass-wiring 626 for islanded mode operation.

Figure 7:
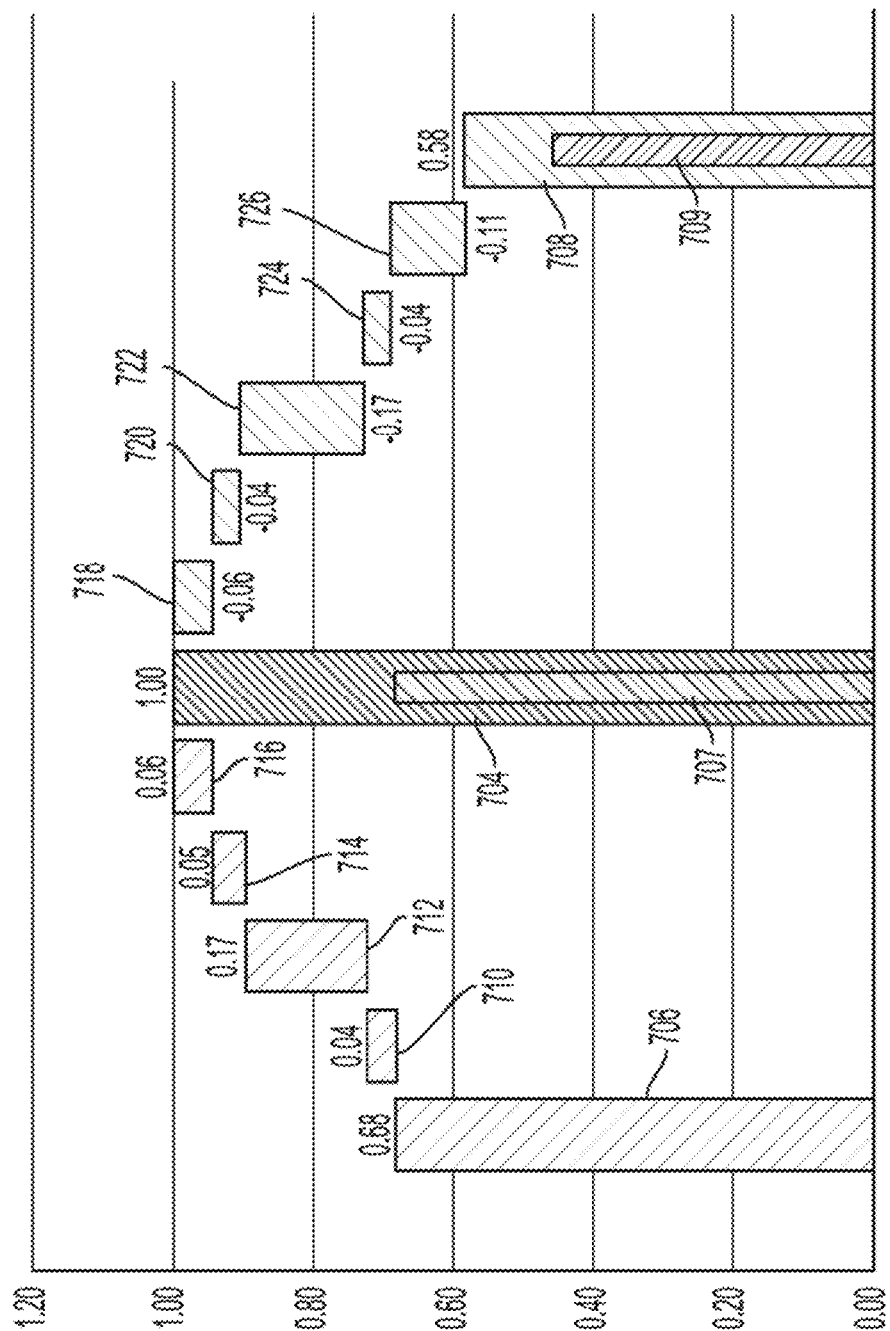
FIG. 7 is a graph illustrating the reduced cost of the disclosed PV-battery system according to one aspect of the present disclosure.

FIG. 7 is a graph 700 illustrating the reduced cost of the disclosed PV-battery system according to various aspects of the present disclosure. All cost breakdowns are normalized to that of the median reported cost (e.g., the vertical axis normalized at 1.0) of installing conventional DC-coupled (FIG. 2A) or AC-battery systems (FIG. 2B). FIG. 7 illustrates a cost and savings of the disclosed stationary battery system of FIG. 3 compared with conventional systems that lack the disclosed features. For example, the conventional system requires various costs including: exemplary cost 706 (e.g., batteries, enclosure, and inverter), exemplary cost 710 (e.g., ancillary hardware), exemplary cost 712 (e.g., professional installation), exemplary cost 714 (e.g., auto-transfer switches (ATS)), exemplary cost 716 (e.g., install ATS). A summation of each of these exemplary costs produces the median reported cost 704. In comparison, the system of FIG. 3 including features disclosed herein are able to recognize various cost improvements. For instance, a system as disclosed herein, benefits from exemplary cost improvement 718 (built-in ATS, no install required), exemplary cost improvement 720 (built-in ATS, no separate hardware required), exemplary cost improvement 722 (wall-plugged, self-installed), exemplary cost improvement 724 (all-inclusive hardware package), exemplary cost improvement 726 (includes a battery and inverter as a complete set). The summation of the exemplary cost savings results in the cost 708 (including component cost 709) of the disclosed system as disclosed herein. The difference between the cost 708 and the median cost 704 (including component cost 707) represents the savings improvement of the disclosed system over the conventional median system.

Figure 8:
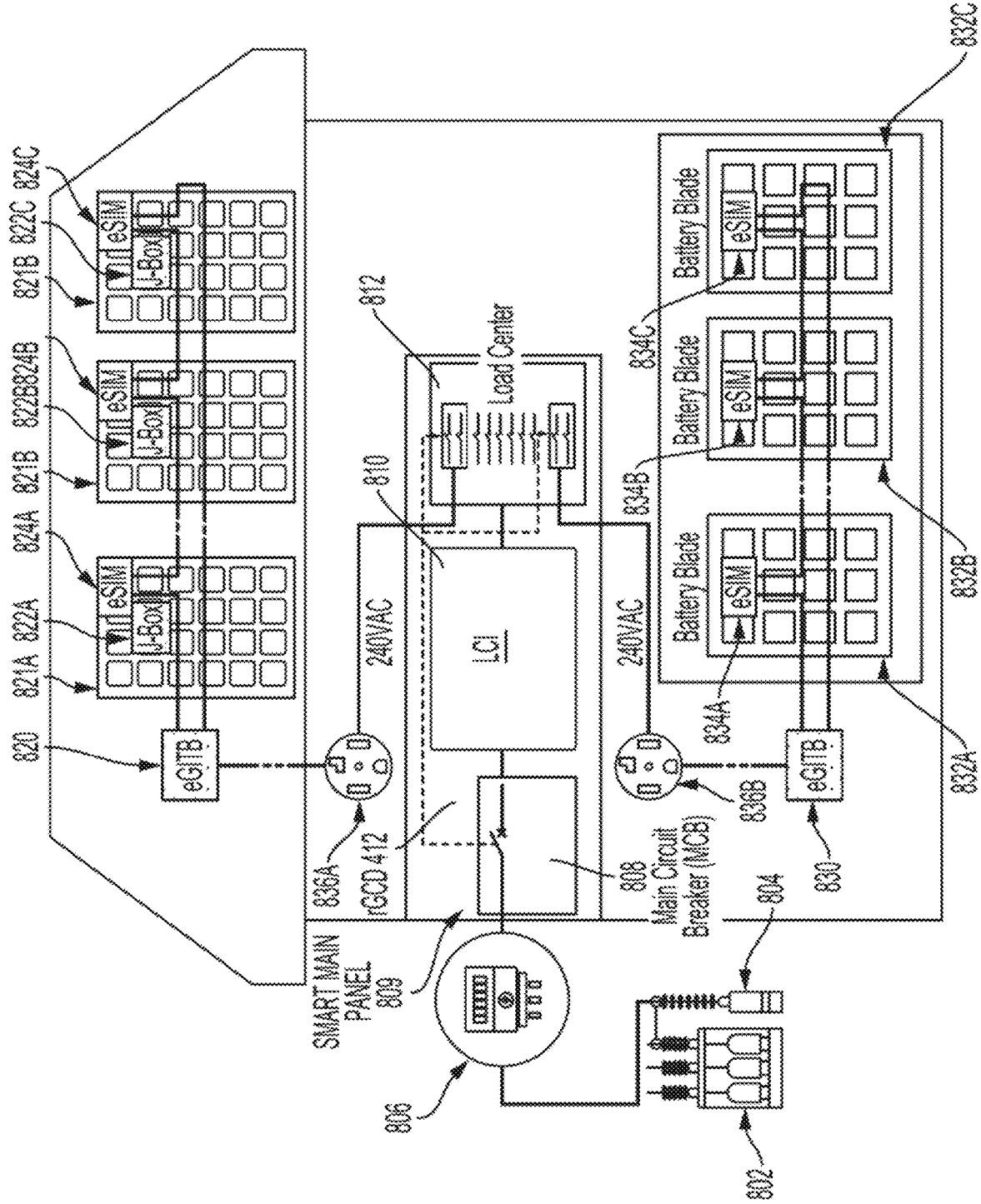
FIGS. 8-9 depict a load circuit isolator inside the main electric panel for implementing a grid circuit disconnector component according to one aspect of the present disclosure.
Figure 9:
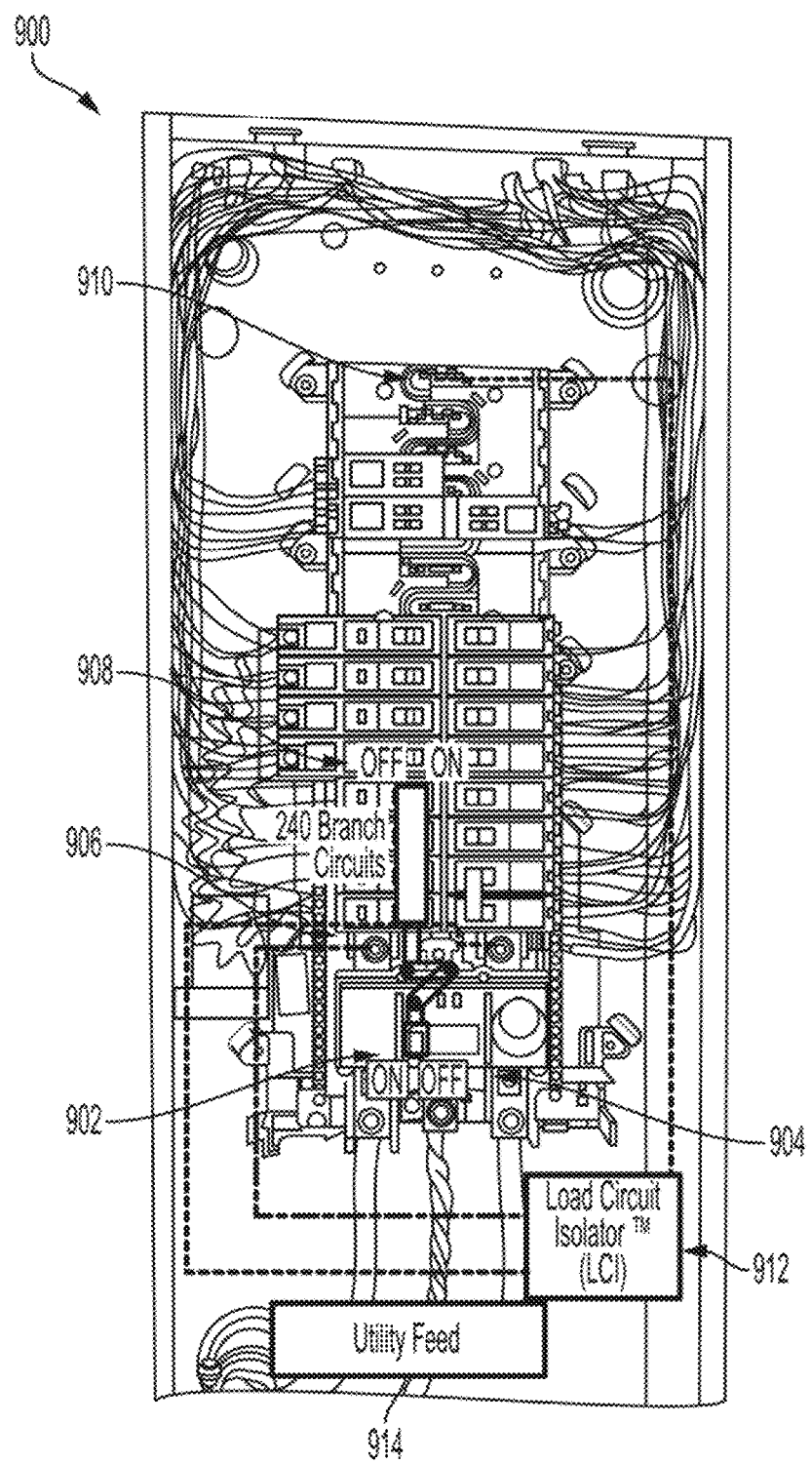

FIGS. 8-9 depict a further circuit implementation of a grid circuit disconnector 809 (GCD) component according to various aspects of the present disclosure. In particular, FIGS. 8-9 depict a form of the GCD 809 shown in FIG. 4. The aspect of GCD shown in FIGS. 8-9 may be referred to as a load circuit isolator 810 (LCI). As shown in FIG. 8, the LCI 810 disconnects the entire building load center 812 from the main circuit breaker 808 (MCB) during a grid outage thereby achieving back-feed prevention to the grid network (e.g., a first grid network portion 802 and a second grid network portion 804) and serving all loads in the property with the resident PV panel array (821A-821C) and battery blades (832A-832C) system. FIG. 8 illustrates various other circuit components as described herein. For instance, FIG. 8 illustrates PV eGITB 820 and battery bank eGITB 830, PV AC output 836A, battery group AC output 836B, and electric meter 806. FIG. 8 also depicts that each PV panel of the PV panel array 821A-821C has a corresponding EIC 824A-824C and junction box 822A-822C, each battery blade 832A-832C has a corresponding EIC 834A-834C, and the grid circuit has a first grid network portion 802 and second grid network portion 804, and an electric meter 806.

FIG. 9 illustrates a ganging mechanism 900 that can be utilized by all embodiments of GCD (shown in FIGS. 5-6 and FIGS. 8-9, respectively) to disconnect all generating load circuits and their corresponding circuit breakers. As shown in FIG. 9, disengagement of the MCB 902, such as by physically turning-off the arm of the circuit breaker, causes the ganged circuit breakers 908 to disconnect. This causes all generating circuits, such as those connected to the eGITBs for the PV and battery systems, to be disconnected from the load center. The eGITBs may also electrically disconnect from their respective load circuit breakers upon detection of a low voltage at their electric outlet or output terminals. In this way, multiple layers of disconnection may be used to increase the safety of disclosed system. Specifically, emergency service personnel, such as firefighters, can disengage the MCB 902 along with the other generating circuits (that are ganged to the MCB) and attend to any emergencies without the threat of any energized or live electrical systems in the house. While a mechanical ganging mechanism is depicted in FIG. 9, various other ganging techniques may be employed, for deactivation of the DER circuit breakers. The techniques may involve detection (optical or otherwise) of the MCB switch arm in the OFF-position. While two specific aspects of the GCD have been described above, other suitable aspects may be derived from the disclosed examples of the GCD, whether in isolation or in combination. FIG. 9 also depicts a utility feed 914 coupled to the MCB 902 at junction point 904 and the supply mains 910 coupled to the bus bars 906. Additionally, FIG. 9 illustrates the bus bars 906 coupled to a LCI 912. The LCI 912 is described previously herein.

Figure 10:
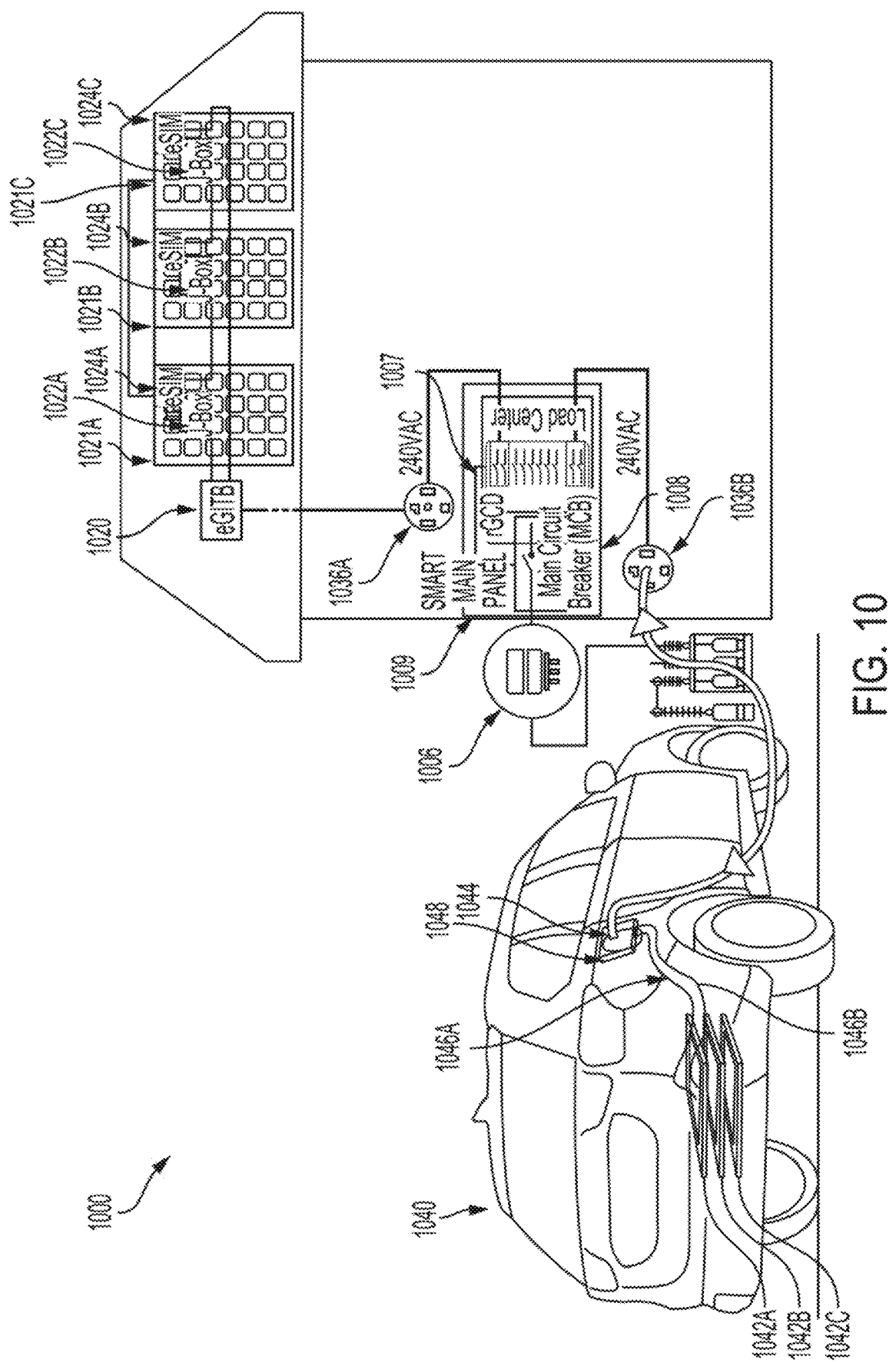
FIG. 10 depicts grid-circuit disconnector component that can be configured and retrofitted, and that includes a portable battery group according to one aspect of the present disclosure.

FIG. 10 depicts a configurable and retrofittable grid circuit disconnector component including a portable battery group 1042A-1042C according to one aspect of the present disclosure. The portable battery group 1042A-1042C can be used with any aspect of FIGS. 1-9. As can be seen in FIG. 10 and as described with regard to FIGS. 4-5, the PV panel array (i.e., including panel arrays 1021A-1021C) is installed in the house rooftop while the portable battery group (1042A-1042C) is housed in the vehicle 1040 or other type of automobile. Each PV panel of the PV panel array 1021A-1021C has a corresponding EIC 1024A-1024C and junction box 1022A-1022C. In an alternate arrangement, the functionalities of the junction box 1022A-1022C may be fully accommodated by the EIC 1024A-1024C, thereby eliminating the junction box from the PV panel. Each battery blade (e.g., battery blade 1042A) in portable battery group 1042A-1042C has a corresponding EIC. The PV panel array (1021A-1021C) or the group of battery blades (1042A-1042C) each may provide 240V in AC output (e.g., PV AC output 1036A or portable battery group AC output 1036B) from an eGITB (i.e., PV panel array eGITB 1020 or portable battery group eGITB 1048) to the main electric panel or the load center of the house. In this way, the vehicle 1040 and/or the PV panel array 1021A-1021C may provide power to the property. The vehicle 1040 includes power adapter module 1044, and conductors 1046A-1046B. The property includes an electrical meter 1006, an electric panel 1009, a main circuit breaker 1008, and GCD 1007.

For example, a property power system includes an array of photovoltaic (PV) panels and a portable battery group. Each PV panel in the array is configured to generate DC electrical energy from solar energy radiated toward the array of PV panels. In some examples, each PV panel of the array of PV panels is coupled to a first synchronized, non-isolated (transformerless in the path of power flow) power conversion module to convert between DC electrical energy and AC electrical energy, targeting an operational characteristic of each PV panel to control delivery of the AC electrical energy of each of the PV panels. The property power system includes a first non-isolated synchronization interface that is configured to aggregate the AC electrical energy of each of the PV panels. The property power system also includes a portable battery group (e.g., battery blades installed in a vehicle) configured to deliver and store electrical energy. Each battery blade of the portable battery group is coupled to a second synchronized, non-isolated power conversion module to convert between DC electrical energy and AC electrical energy targeting an operational characteristic to control delivery and storage of the AC electrical energy of each of the battery blades. The first non-isolated synchronization interface may additionally control delivery of the AC electrical energy resulting from the array of PV panels to one or more of an electrical outlet or the main electric panel on the property. The property power system additionally may include a second non-isolated synchronization interface to control delivery and storage of the AC electrical energy resulting from the group of battery blades to one or more of an electrical outlet or the main electric panel on the property. The property power system also includes a grid circuit disconnector configured to select an islanded mode of operation (or disconnected from the utility grid) and to prevent back-feed of power during grid outage condition while the electrical load center (or the main electric panel) on the property remain energized (powered) by the array of PV panels and/or the portable battery group.

While various details have been set forth in the foregoing description, it will be appreciated that the various aspects of the system and method for providing a property power system behind the meter may be practiced without these specific details. One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Unless specifically stated otherwise as apparent from the foregoing disclosure, it is appreciated that, throughout the foregoing disclosure, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). One having skill in the art will recognize that the subject matter described herein may be implemented in an analog or digital fashion or some combination thereof.

In other instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

In certain cases, use of a system or method may occur in a territory even if components are located outside the territory. For example, in a distributed computing context, use of a distributed computing system may occur in a territory even though parts of the system may be located outside of the territory (e.g., relay, server, processor, signal-bearing medium, transmitting computer, receiving computer, etc. located outside the territory).

What is claimed is:

1. A system for distributing, storing, and generating energy, the system comprising:
   an array of photovoltaic (PV) panels configured to generate DC electrical energy from solar energy radiated toward the array of PV panels, wherein each PV panel of the array comprises a first power conversion module to convert between DC electrical energy and AC electrical energy and to control an operational characteristic of the PV panel;
   a group of battery blades configured to store electrical energy, wherein each battery blade of the group of battery blades comprises a second power conversion module to convert between DC electrical energy and AC electrical energy and to perform charge balancing among the battery blades of the group of battery blades;
   a first synchronization interface configured to aggregate the AC electrical energy of each of the PV panels, to control delivery of the AC electrical energy of each of the PV panels, as aggregated, to one or more of an electrical outlet or panel, and to implement anti-islanding protection;
   a second synchronization interface configured to allow and control bidirectional power flow for storing energy and supplying power to electrical loads and aggregate the AC electrical energy of each of the battery blades, to control delivery of the AC electrical energy of each of the battery blades, as aggregated, to one or more of an electrical outlet or panel, and to implement anti-islanding protection, wherein the second synchronization interface includes a controller configured to adjust operational field quantities of the battery blades to control the charge balancing; and
   a grid circuit disconnector that includes a controller configured to select an islanded mode of operation and to prevent back-feed of power during a grid-outage condition while one or more of the array of PV panels and the group of battery blades is powering an electrical load center in a property that is electrically couplable to the array of PV panels, to the group of battery blades, and to a power grid.

2. The system of claim 1, wherein the grid circuit disconnector comprises a communication circuit configured to communicate with the power grid to respond to power grid signals to change one or more of an active and a reactive load of the property.

3. The system of claim 2, wherein the grid circuit disconnector is further configured to adjust active and reactive loads of the property based on learning an energy usage and dynamic load profile of the property.

4. The system of claim 2, wherein the grid circuit disconnector defines a point of access that is accessible to control the system and to perform a grid operation.

5. The system of claim 1, wherein the property is a vehicle, and wherein the group of battery blades and each of the second power conversion modules reside within the vehicle, and wherein the second synchronization interface resides inside or outside the vehicle.

6. The system of claim 1, wherein the property comprises a main circuit breaker coupled via a ganging mechanism to a plurality of generating load circuit breakers.

* * * * *